United States Patent
Duval et al.

(10) Patent No.: US 9,343,328 B2
(45) Date of Patent: May 17, 2016

(54) PHOTOLITHOGRAPHIC, THICKNESS NON-UNIFORMITY, COMPENSATION FEATURES FOR OPTICAL PHOTOLITHOGRAPHIC SEMICONDUCTOR STRUCTURE FORMATION

(71) Applicant: Raytheon Company, Waltham, MA (US)

(72) Inventors: Paul J. Duval, Lexington, MA (US); Paul M. Ryan, Boston, MA (US); Christopher J. MacDonald, Medford, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/589,251

(22) Filed: Jan. 5, 2015

(65) Prior Publication Data

US 2015/0111379 A1    Apr. 23, 2015

Related U.S. Application Data

(62) Division of application No. 13/871,190, filed on Apr. 26, 2013, now abandoned.

(51) Int. Cl.
| | |
|---|---|
| H01L 21/32 | (2006.01) |
| H01L 21/768 | (2006.01) |
| H01L 29/78 | (2006.01) |
| H01L 21/027 | (2006.01) |
| H01L 21/28 | (2006.01) |
| H01L 21/311 | (2006.01) |

(52) U.S. Cl.
CPC ............ *H01L 21/32* (2013.01); *H01L 21/0274* (2013.01); *H01L 21/28123* (2013.01); *H01L 21/31144* (2013.01); *H01L 21/76895* (2013.01); *H01L 29/78* (2013.01)

(58) Field of Classification Search
CPC .............................. G01L 21/32; G01L 21/768
USPC ........................ 257/288; 438/597, 401, 104
See application file for complete search history.

(56) References Cited

U.S. PATENT DOCUMENTS

| | | | |
|---|---|---|---|
| 5,350,703 A | | 9/1994 | Lee |
| 5,545,579 A | * | 8/1996 | Liang et al. ............... 438/291 |
| 6,100,947 A | | 8/2000 | Katayama |
| 2002/0160590 A1 | | 10/2002 | Hashimoto et al. |
| 2009/0068572 A1 | | 3/2009 | Lv et al. |
| 2009/0108305 A1 | | 4/2009 | Riviere-Cazaux et al. |

(Continued)

OTHER PUBLICATIONS

Invitation to Pay Additional Fees and, Where Applicable, Protest Fee, PCT/US2014/020186, May 23, 2014, pp. 1-6

(Continued)

*Primary Examiner* — Sheng Zhu
(74) *Attorney, Agent, or Firm* — Daly, Crowley, Mofford & Durkee, LLP

(57) ABSTRACT

A semiconductor structure having a substrate; an active device formed in an active semiconductor region of the substrate, the active device having a control electrode for controlling a flow of carriers through the active semiconductor region between a pair of electrical contacts; and a photolithographic, thickness non-uniformity, compensation feature, disposed on the surface substrate off of the active semiconductor region. In one embodiment the feature comprises pads on the surface of the substrate and off of the active semiconductor region.

6 Claims, 11 Drawing Sheets

(56) References Cited

U.S. PATENT DOCUMENTS

| | | |
|---|---|---|
| 2009/0206373 A1 | 8/2009 | Yafune et al. |
| 2010/0210070 A1 | 8/2010 | Wakana et al. |
| 2011/0147765 A1 | 6/2011 | Huang et al. |

OTHER PUBLICATIONS

Notification of Transmittal of the International Search Report and the Written Opinion of the International Searching Authority, or the Declaration, PCT/US2014/020186, Jul. 24, 2014, 1 page.

International Search Report, PCT/US2014/020186, Jul. 24, 2014, 5 pages.

Written Opinion of the International Searching Authority, PCT/US2014/020186, Jul. 24, 2014, 8 pages.

Notification Concerning Transmittal of the International Preliminary Report on Patentability Report on Patentability (Charter I of the Patent Cooperation Treaty), PCT/US2014/020186, Nov. 5, 2015, 1 page.

International Preliminary Report on Patentability, PCT/US2014/020186, Oct. 27, 2015, 9 pages.

* cited by examiner

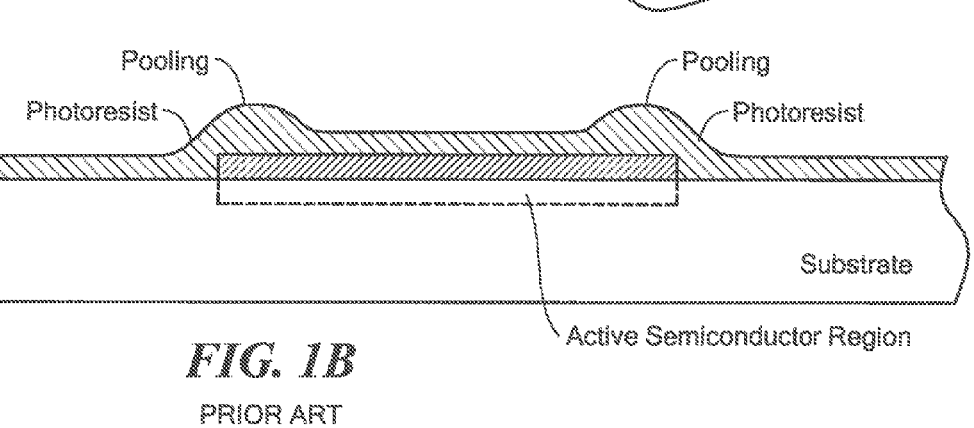
FIG. 1A PRIOR ART
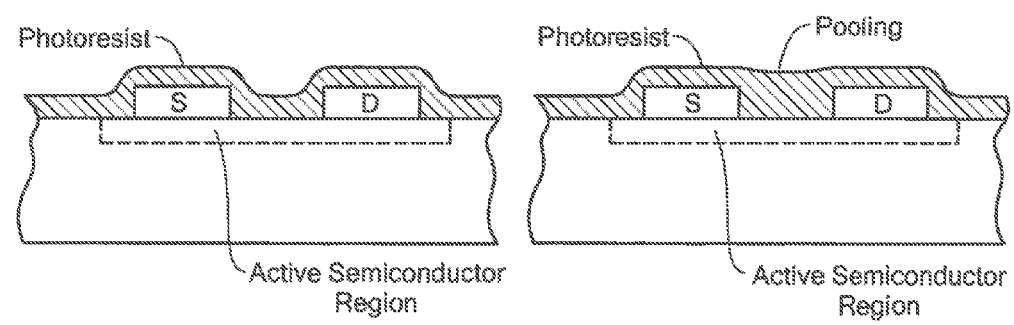
FIG. 1B PRIOR ART
FIG. 1C          FIG. 1D

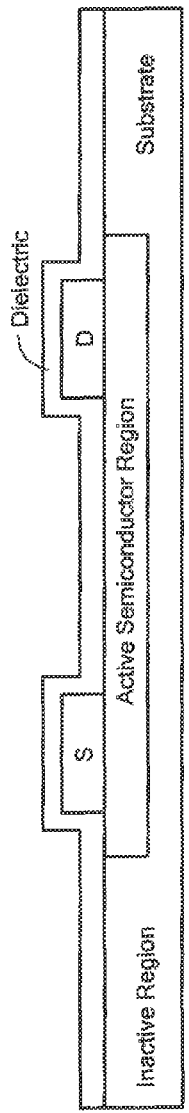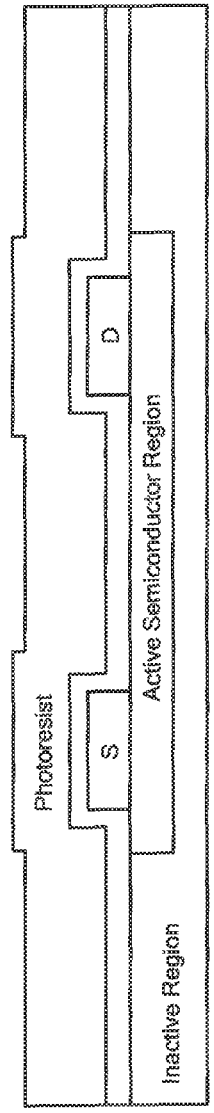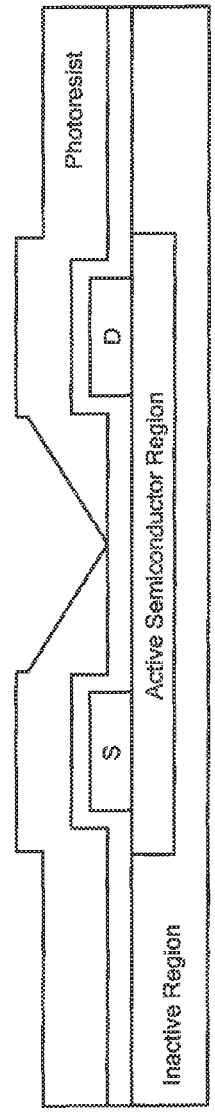

PHOTOLITHOGRAPHIC, THICKNESS NON-UNIFORMITY, COMPENSATION FEATURES FOR OPTICAL PHOTOLITHOGRAPHIC SEMICONDUCTOR STRUCTURE FORMATION

RELATED APPLICATIONS

This application is a Divisional application of U.S. patent application Ser. No. 13/871,190 entitled PHOTOLITHOGRAPHIC, THICKNESS NON-UNIFORMITY, COMPENSATION FEATURES FOR OPTICAL PHOTOLITHOGRAPHIC SEMICONDUCTOR STRUCTURE FORMATION, filed on Apr. 26, 2013, which is incorporated herein by reference in its entirety.

TECHNICAL FIELD

This disclosure relates generally to optical photolithographic semiconductor structure formation and more particularly to photolithographic, thickness non-uniformity, compensation features for optical photolithographic semiconductor structure formation.

BACKGROUND AND SUMMARY

As is known in the art, photolithography is used extensively in the fabrication of a wide variety of semiconductor structures. One type of semiconductor structure has active devices, such as field effect transistors (FETs), formed in active semiconductor regions (sometimes referred to as the active regions) of a substrate. More particularly, a plurality of active semiconductor devices is formed in a semiconductor region, typically a semiconductor epitaxial layer, formed over the substrate. A gate electrode controls a flow of carriers passing through the active semiconductor region between a source electrode and a drain electrode. More particularly, the active semiconductor region has a pair of source and drain electrodes in ohmic contact with the active semiconductor region and a gate electrode in Schottky contact with the source and drain region. The gate electrode is a control electrode for controlling a flow of carriers through the active semiconductor region between the source and drain electrodes.

One technique used to isolate the active devices is to etch away boundary portions of the semiconductor active region down to an insulating layer to thereby leave isolated semiconductor mesas with each active device being formed in a corresponding one of the mesas. Another technique uses ion implantation around the boundary portions of the semiconductor active regions to render the boundary regions inactive (i.e., into a non-semiconductor, insulating region) to isolate the active devices. The region in the active semiconductor region under the gate electrode and through which the carriers flow is sometimes referred to as the gate channel. The region of the active semiconductor region between the source and drain electrodes is sometimes referred to as the source-drain (SD) channel. The length of the gate electrode is the dimension of the gate electrode measured along a direction passing through the source and drain electrodes and is referred to as the gate length.

One process used to form such FET is to first form source and drain contacts in ohmic contact with the surface of the active semiconductor region as shown in (FIG. 1A) and then cover the entire semiconductor surface including the source (S) and drain (D) contacts, with a dielectric layer, as shown in FIG. 2A. Next, a photoresist layer is deposited over the entire dielectric layer (both the portion of the dielectric layer on the active semiconductor region and the portion of the dielectric layer adjacent to the semiconductor active region, as shown in FIGS. 1B-1D and 2B. More particularly, the elevation of the tops of the source and drain contacts above the surface of the substrate creates topography height variations in the photoresist layer (i.e., the above-described "pools") at the two ends of semiconductor active regions lying between the two ohmic contact metals used for the source and drain contacts. This topography height variation causes the above-described pooling. It is noted that this pooling of photoresist layer near the source and drain contacts is also over portions of the active semiconductor region including the region between the source and drain contacts where there the gate channel is to be formed.

After the photoresist layer deposition, a binary mask, not shown, is placed over the photoresist layer. Next, the masked photoresist layer is exposed to ultraviolet light, and then developed to form a window in the photoresist layer over portions of the dielectric layer disposed over the gate formation region on the active semiconductor region, FIG. 2C. Next, the windowed photoresist layer is exposed to an etchant to remove the exposed dielectric layer and thereby expose the region of the active semiconductor region where the gate electrode is to be contact therewith, FIG. 2D. Next, the gate electrode is to be formed in Schottky contact with the exposed region of the active semiconductor region. Unfortunately, because of the change in the surface topology over which the photoresist layer is deposited, for example over the source and drain contacts, portions of the above-described pooling of the photoresist are created on the outer portions of the source and drain contacts and on the region where the gate electrode is to make Schottky contact with the underlying portion of the active semiconductor region (i.e., the source drain (SD) channel). That is, the pooling of photoresist layer near the source and drain contacts is also over portions of the active semiconductor region including the region between the source and drain contacts where there the gate channel is to be formed.

This pooling causes the photoresist to be thicker than the desired thickness on the active semiconductor region and, after the photoresist is developed, results in a failure of that portion of the gate electrode to make contact with the underlying portion of the active semiconductor region but rather terminates on the silicon nitride dielectric layer as shown in FIGS. 2 and 2E. The failure to make contact with the underlying portion of the active semiconductor region results in a "pinched characteristic", the gate fails to make Schottky contact with the active semiconductor region.

This has been addressed in the e-beam process by adding a patch feature to allow additional exposure in this region; however when less expensive optical lithography is used to pattern the photoresist layer, a patch feature requires either an additional mask and exposure step using a sub resolution patch feature, or a patch made by increasing the size of the gate in the region where the resist is thicker so that additional exposure energy can be transferred to this region. When using optical lithography without one of these patch features, an increase in the exposure dose of the ultraviolet light would be required to clear the pooling region in photoresist layer near the edge of the SD channel and thereby prevent "pinched gates". This would however result in an increase in gate channel length in the region of the active semiconductor region where there is this increased exposure and thus would limit the minimum critical dimension (CD) (i.e., the gate channel length) that can be achieved with a binary mask and this increase of the gate channel length in the active region of the device can cause poor electrical performance.

In accordance with the present disclosure, a semiconductor structure is provided having: a substrate having an inactive region and an adjacent active semiconductor region; an active device formed in the active semiconductor region of the substrate, the active device having a control electrode for controlling a flow of carriers through the active semiconductor region, between a pair of electrical contacts on the surface of the substrate; and a photolithographic, thickness non-uniformity, compensation feature, on the inactive region.

The inventors have recognized that making the pooling occur in regions off the active semiconductor region (i.e., on the inactive region) removes the requirement of using the increase in the exposure dose of the ultraviolet light on the active semiconductor region where the gate is to be formed. The non-uniformity, compensation feature shifts the pooling from regions on the active semiconductor region to regions off the active semiconductor region. More particularly, the photoresist layer is deposited with a proper thickness on the non-pad regions of the substrate so that this proper thickness will be on the portions of the active semiconductor region where the gate electrode will be formed.

In one embodiment, the non-uniformity, compensation feature includes pads, the pads being at substantially the same elevation as the tops of the electrical contacts, and elevating the photoresist in regions off of the active region (i.e., the elevated regions causing the pooling). This elevated photoresist then continues over the active semiconductor region at substantially the same elevation as the tops of the electrical contacts while being at the proper elevation over the active semiconductor region where the gate electrode is to be formed (i.e., the non-electrical contact regions). Further such shifting of the position of the pooling to regions off the semiconductor active regions enables the use of gate formation compensation such as enlarging the gate opening in the gate mask to allow more energy to be delivered to the region of thicker resist with any increase in gate length resulting from this larger section occurring in a region which does not impact device performance (i.e., off of the active semiconductor region).

In one embodiment, the pads are on the inactive region.

In one embodiment, the feature comprises two pair of pads on opposite sides of the active semiconductor region.

In one embodiment, the pads in each pair of the pads are disposed along parallel lines displaced from a line passing through the control electrode.

In one embodiment, the compensation feature comprises a region in the control electrode on the inactive region that is wider than a region of the control electrode on the active semiconductor region and narrower than the contact pad for the control electrode. The width of the region in the control electrode is selected to increase the relative intensity of ultraviolet light transmitted such that the thicker resist in the region of the gate electrode is sufficiently exposed.

In one embodiment, a method is provided for forming a semiconductor structure, such structure having: a substrate having an active semiconductor region and an adjacent inactive region; an active device formed in the active semiconductor region of the substrate, the active device having a control electrode for controlling a flow of carriers through the active semiconductor region between a pair of electrical contacts. The method includes: forming a photoresist layer over the pair of contacts prior to formation of the gate electrode; and providing a photolithographic, thickness non-uniformity, compensation feature prior to the forming of the photoresist layer, the feature being disposed on the surface substrate on the inactive region for preventing pooling of the photoresist layer on the active semiconducting region.

In one embodiment, the feature forming includes forming pads on the inactive region.

In one embodiment, a semiconductor structure is provided comprising: a substrate; an active device formed in the active semiconductor region of the substrate, the active device having a control electrode for controlling a flow of carriers through the active semiconductor region between a pair of electrode, the control electrode extending from the active semiconductor region to a contact pad on the inactive region and wherein a portion of the control electrode between the active semiconductor region and the contact pad is wider than a portion of the control electrode on the active semiconductor region.

In one embodiment, a semiconductor structure is provided, comprising: a substrate; an active device formed in an active semiconductor region of the substrate, the active device having a control electrode for controlling a flow of carriers through the active semiconductor region between a pair of additional electrodes on the active semiconductor region, the control electrode extending from the active semiconductor region to a region on the substrate off of the active semiconductor region; a pair of pads off of the active semiconductor region and adjacent to the pair of additional electrodes; and wherein the portion of the control electrode off of the active semiconductor region is disposed between the pair of pads.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 1A is a plan view sketch of a semiconductor FET structure according to the PRIOR ART prior to forming a gate electrode for the FET;

FIGS. 1B-1D are a cross sectional sketch of the semiconductor FET structure of FIG. 1A according to the PRIOR ART, such cross section being taken along line 1B-1B, 1DC=1C and 1D-1D, respectively in FIG. 1A;

FIGS. 2A-2E are cross sectional sketches of the semiconductor FET structure of FIG. 2 according to the PRIOR ART at various stages in the fabrication thereof; the cross section of FIG. 2E being taken along line 2E-2E in FIG. 2;

Like reference symbols in the various drawings indicate like elements.

DETAILED DESCRIPTION

Figure 2:
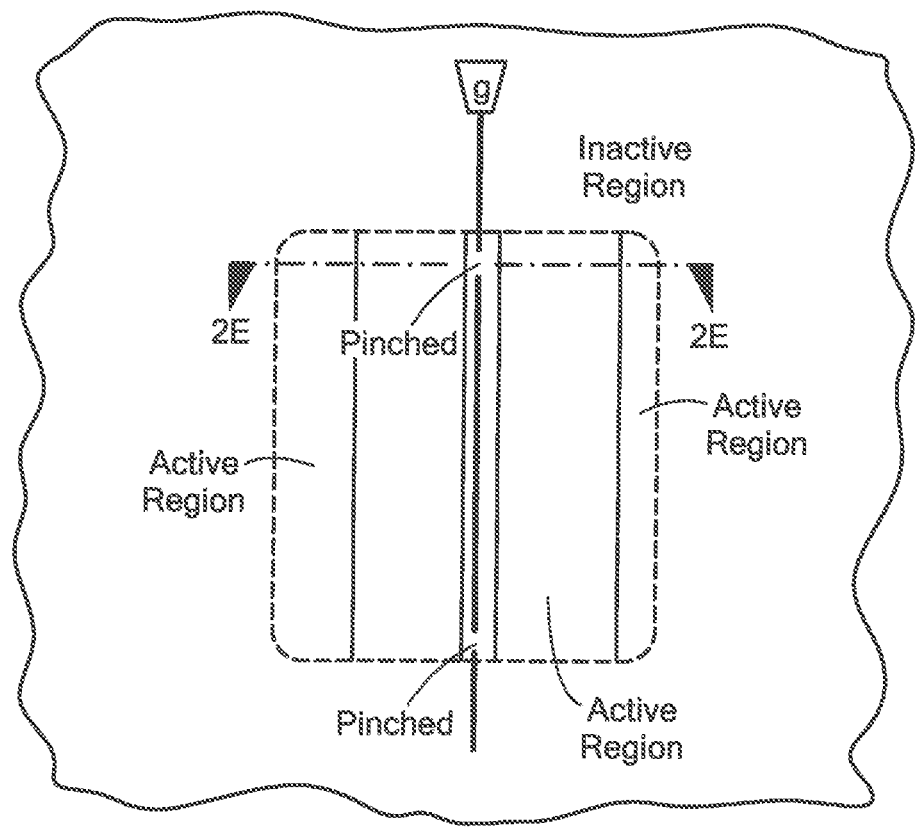
FIG. 2 is a plan view sketch of the semiconductor FET structure of FIG. 1A according to the PRIOR ART forming a gate electrode for the FET.
Figure 2D:
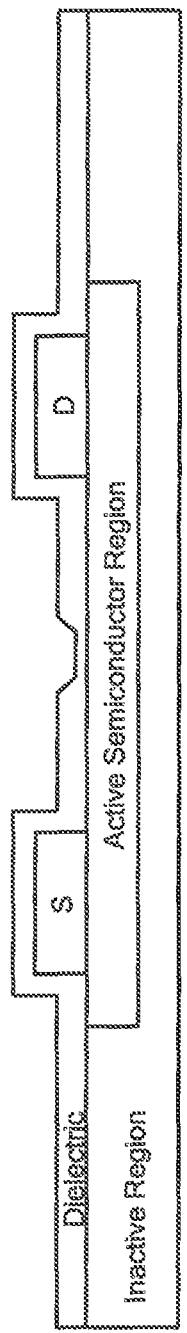
Figure 2E:
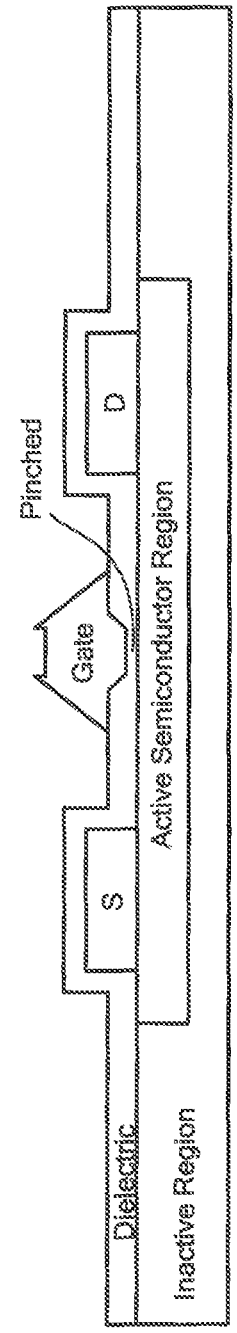
Figure 3:
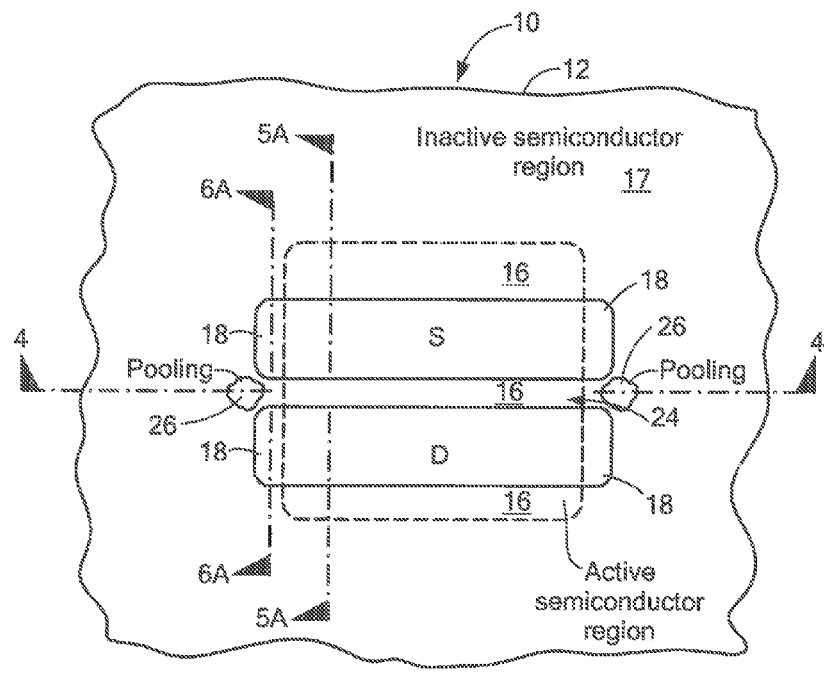
FIG. 3 is a plan view sketch of a semiconductor FET structure according to the disclosure prior to forming a gate electrode for the FET.

Referring now to FIG. 3, a semiconductor structure 10 is shown having a semiconductor substrate 12. The substrate has an active semiconductor region 16 and an adjacent inactive region 17. As will be described, an active device will be formed in an active semiconductor region 16 of the substrate 12, here a field effect transistor (FET) having a control electrode, here gate electrode (GATE), to be described, for controlling a flow of carriers through the active semiconductor region 16 between a pair of electrical contacts, here source contact S and drain contact D, as shown in FIG. 3, in ohmic contact with the active semiconductor region 16. The structure shown in FIG. 3 includes a plurality of photolithographic, thickness non-uniformity, compensation features 18, disposed on the surface substrate 12, off of the active semiconductor region 16 (i.e., the inactive region 17). Here the features 18 are pads formed in this example as extended portions of the source S and drain D contact material; however the extended portions are disposed on non-active portions of the substrate 12 and not on the active semiconductor region 16. Thus, the features 18 are on the surface of the substrate 12 and off of the active semiconductor region 16. Here, the features 18 comprise two pair of the pads 18 on opposite sides of the active semiconductor region 16, as shown. As will be described, a photolithographic, thickness non-uniformity, compensation feature 18 is formed prior to the forming of the photoresist layer for preventing forming pooling of the photoresist layer on the active semiconducting region 16.

Figure 4:
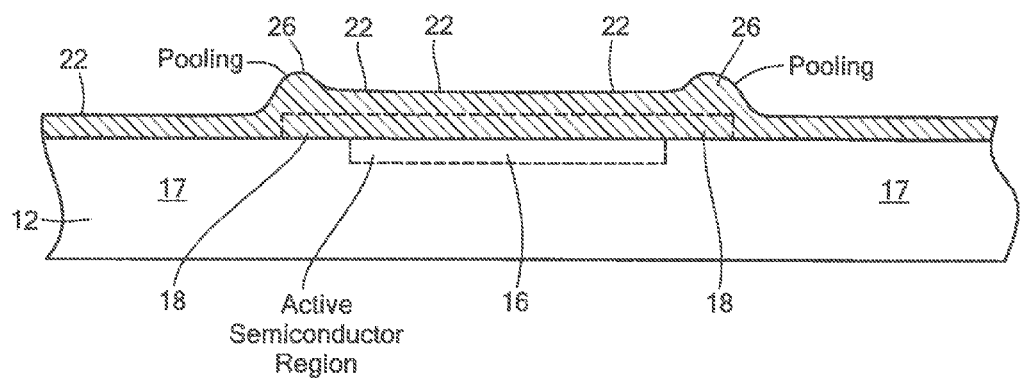
FIG. 4 is a cross sectional sketch of the semiconductor FET structure of FIG. 3 according to the disclosure after forming photoresist layer over the structure of FIG. 3 for use in subsequently forming a gate electrode for the FET.

More particularly, after forming the source S and drain D contacts and the features 18, and referring also to FIG. 4, a photoresist layer 22 is deposited over the surface of the formed structure. More particularly, the photoresist layer 22 is deposited with a proper thickness on the non-pad regions of the substrate so that this proper thickness will be on the portions of the active semiconductor region 16 (FIG. 3) where the gate electrode (GATE) will be formed (i.e., on the non-electrical contact regions). The pads 18 being at substantially the same elevation as the tops of the electrical contacts (i.e., the source S and drain D contacts) and extended beyond the active region 16 cause the photoresist layer 22 to pool in the region off the active region 16 while the photoresist layer 22 over the active region and in the region between the source and drain contacts is deposited at the optimum thickness for forming the gate electrode. Further, as will be described, shifting of the position of the pooling regions 24 to regions off the semiconductor active regions 16 (i.e., on the inactive region 17) enables the use of gate electrode (GATE) formation compensation with any increase in gate length occurring in a region (i.e., off of the active semiconductor region 16) which does not impact device performance.

Figure 5:
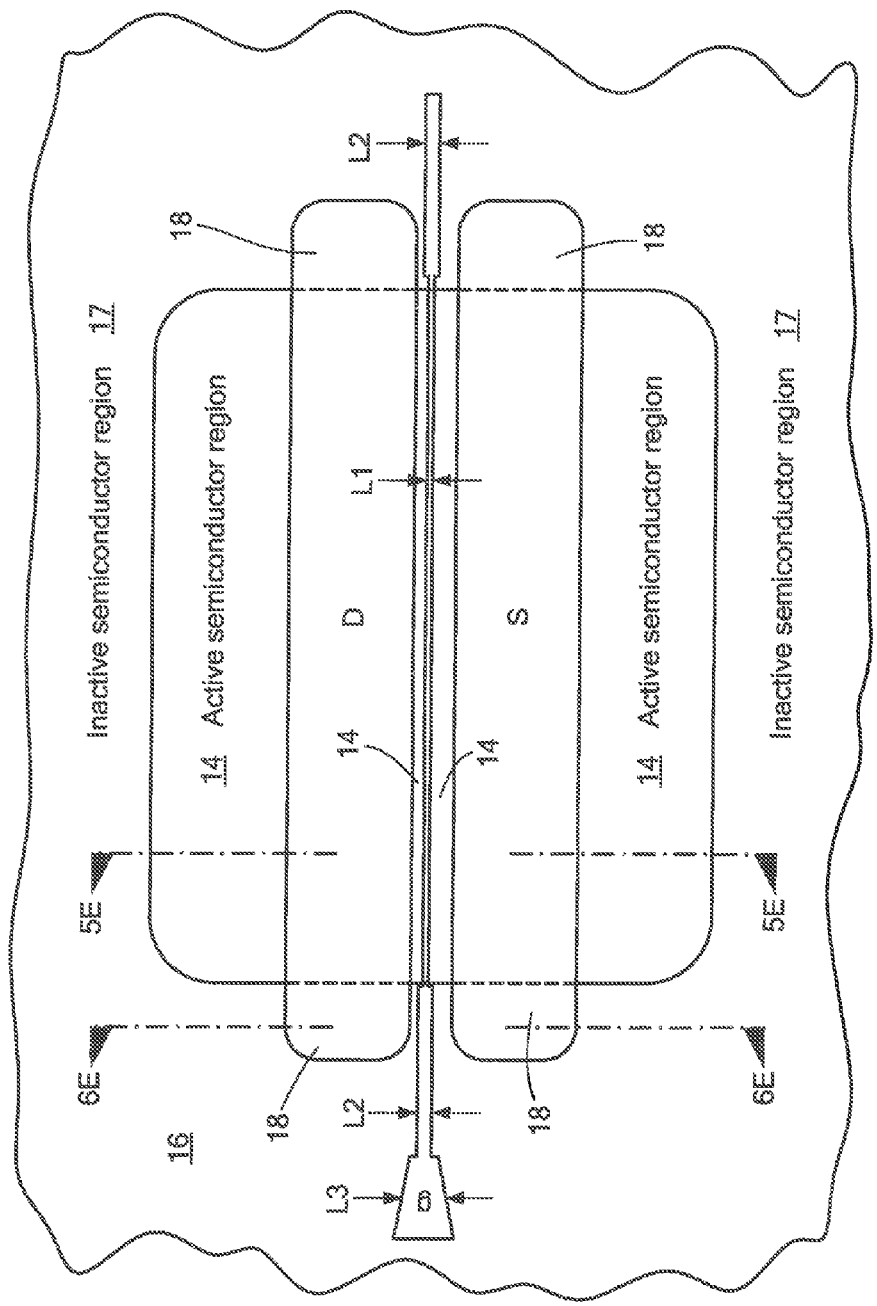
FIG. 5 is a plan view sketch of the semiconductor FET structure of FIG. 3 according to the disclosure.
Figure 5A:
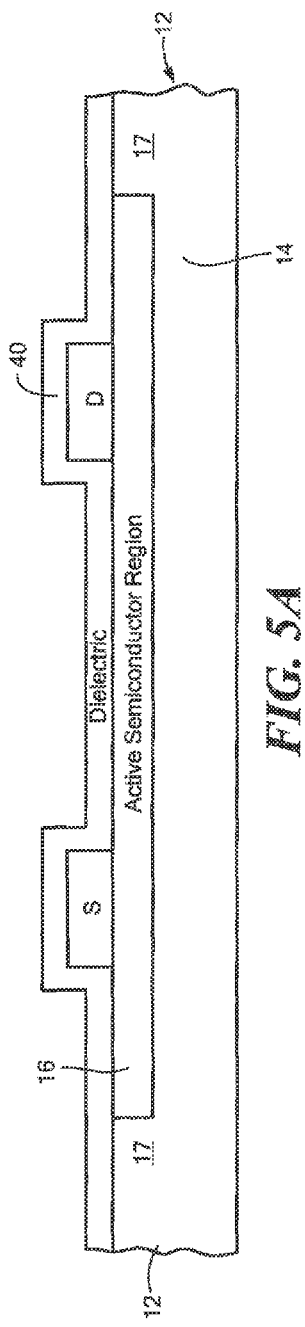
FIGS. 5A-5E are cross sectional sketches of the semiconductor FET structure of FIG. 5 according to the disclosure at various stages in the fabrication thereof; the cross section of FIG. 5E being taken along lime 5E-5E in FIG. 5.
Figure 5B:
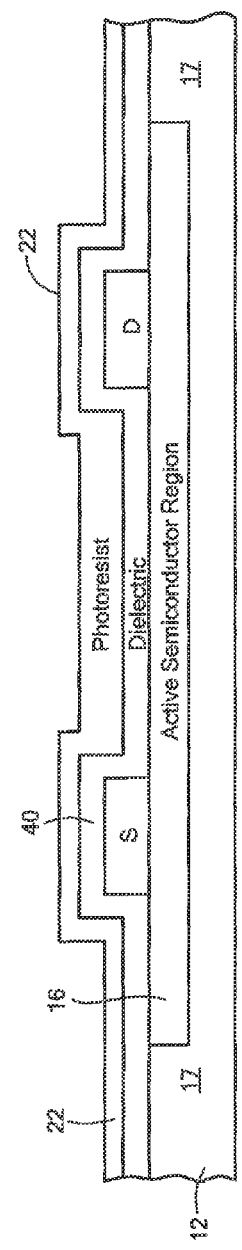
Figure 6A:
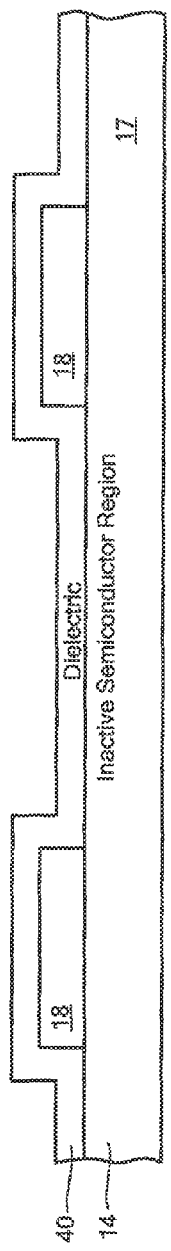
FIGS. 6A-6E are cross sectional sketches of the semiconductor FET structure of FIG. 5 according to the disclosure at various stages in the fabrication thereof; the cross section of FIG. 6E being taken along line 6E-6E in FIG. 5.
Figure 6B:
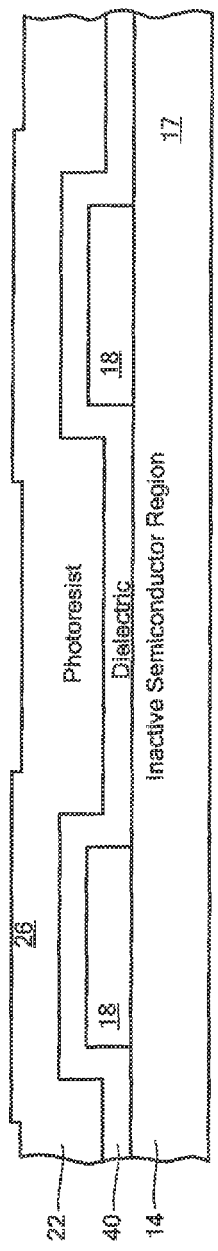

More particularly, and referring now to FIGS. 5A and 6A, after forming the source and drain contacts in ohmic contact with the active semiconductor region 16, a dielectric layer 40 is deposited over the surface of the structure, as shown. It is noted that the dielectric layer 40 is disposed over the region 24 in the active semiconductor region 16 (FIG. 3) where the gate electrode (GATE) is to be formed, over the source S and drain (D) contacts and also over the pads 18 (FIG. 6A). It is noted that the pooling 26 of the photoresist layer 22 thickens the photoresist layer 22 over the inactive region 17 (off the active semiconductor region 16) whereas the photoresist layer 22 is thinner over the active semiconductor region 22 (FIG. 4).

Figure 5C:
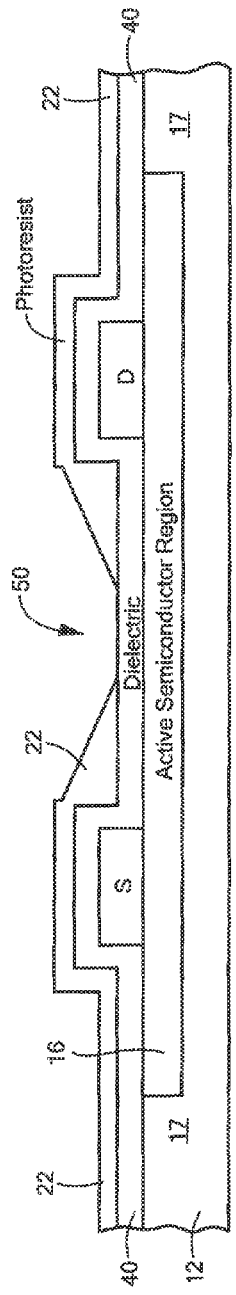
Figure 6C:
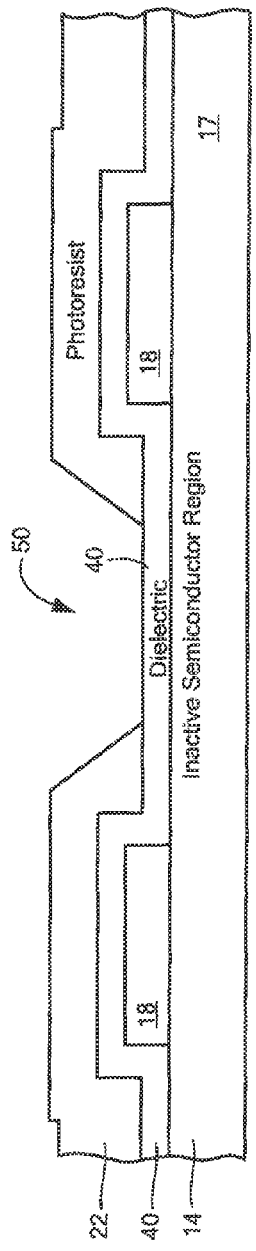
Figure 7:
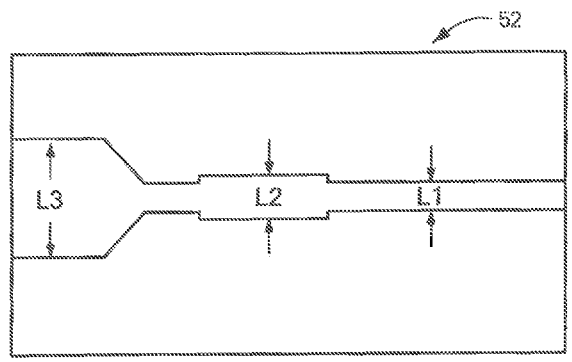
FIG. 7 is a plan view of a mask used in the fabrication of the gate electrode for the semiconductor FET structure of FIG. 3 according to the disclosure.

Referring now to FIGS. 5C and 6C, a window 50 is formed through the photoresist layer 22 using conventional optical photolithographic-etching processing to expose the underlying portion of the silicon nitride layer that is over the regions where the gate electrode (GATE) is to be formed. It is noted that a mask 52, not shown in FIG. 5C or 6C and shown in FIG. 7, has a narrower opening with length L1 when positioned in the region over the active semiconductor region 16 where the gate channel is to be formed than the length L2 over the off active semiconductor region (i.e., on the inactive region 17) and which leads the gate electrode (GATE) in the gate channel to a contact pad 60, FIG. 8. It is noted that the length L2 is narrower than the length L3 of the gate contact pad 60, FIG. 8.

Figure 5D:
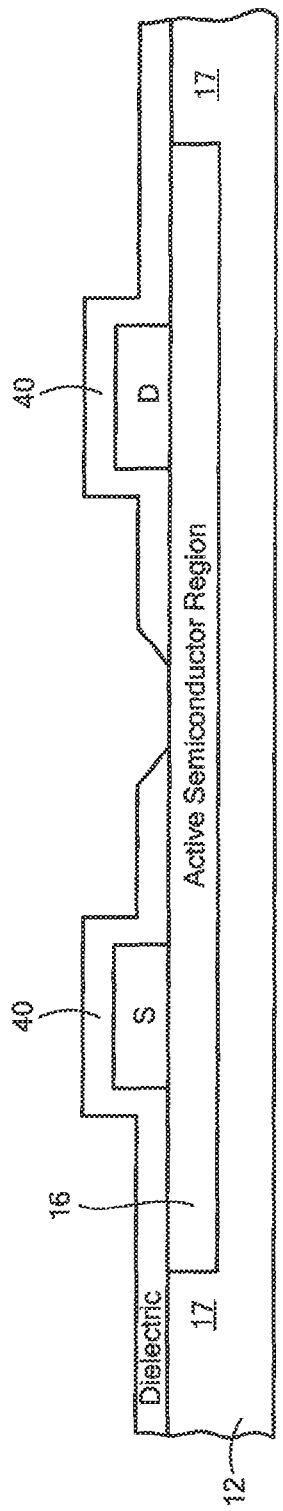
Figure 6D:
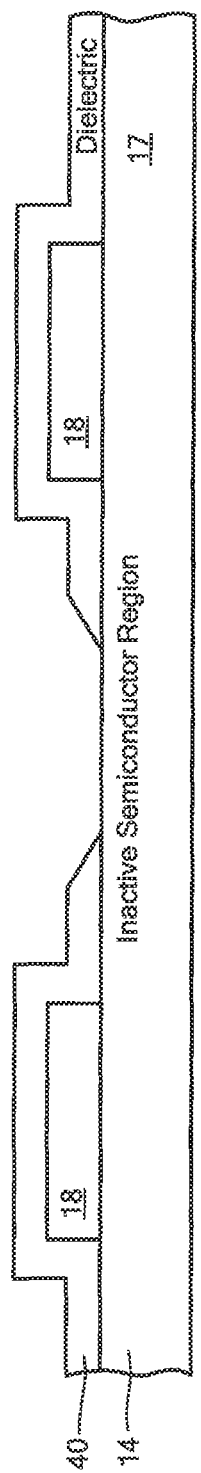

Referring now to FIGS. 5D and 6D, the portions of the dielectric layer 40 are etched to expose underlying portions of the active semiconductor region 16, as shown in FIG. 5D and underlying portions, as shown in FIG. 6D.

Figure 5E:
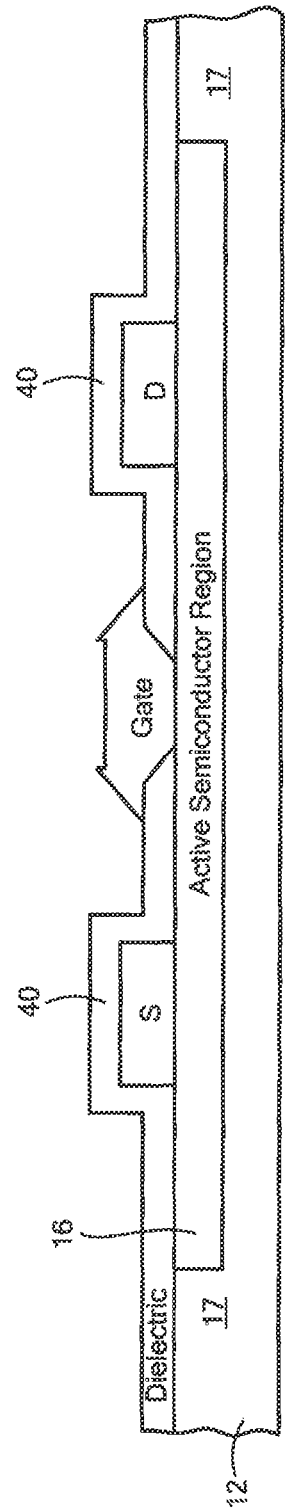
Figure 6E:
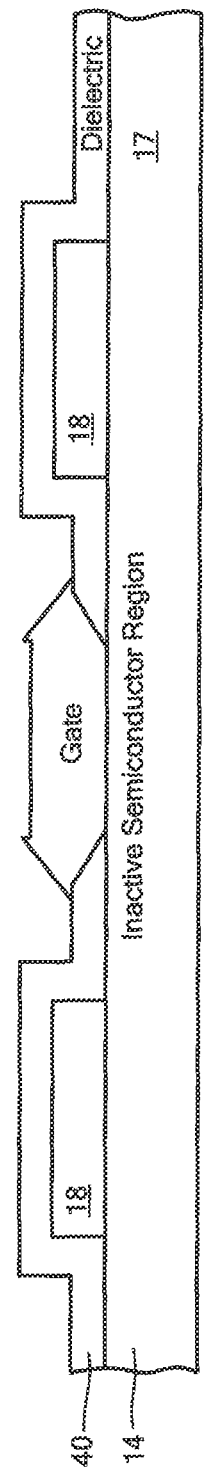
Figure 8:
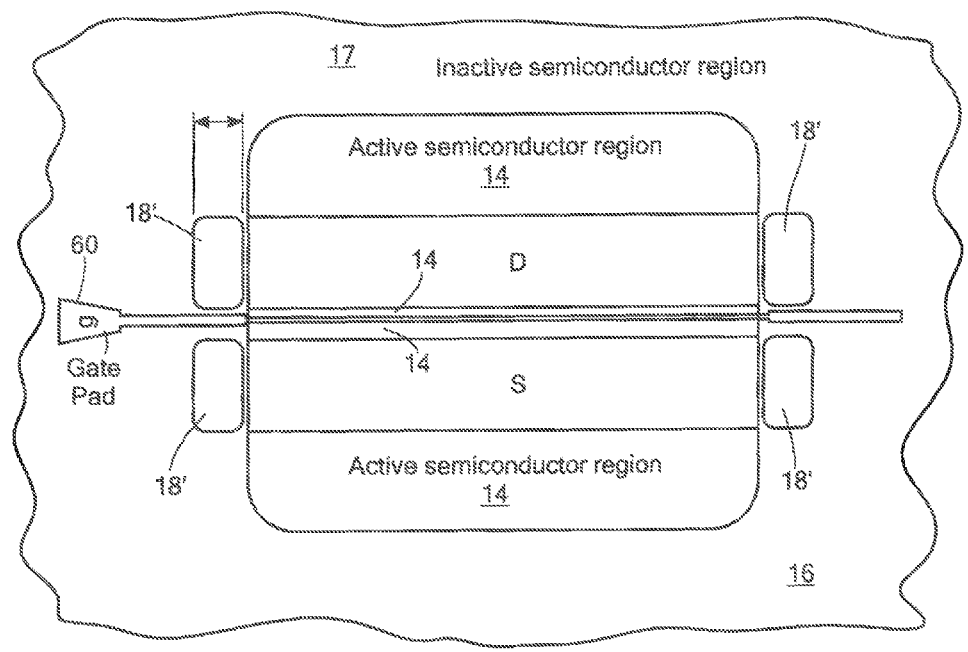
FIG. 8 is a plan view sketch of the semiconductor FET structure of FIG. 3 according to an alternative embodiment of the disclosure.

Next, after removing the photoresist layer 22, the gate electrode (GATE) is formed on the exposed potations of the active semiconductor region 17, as shown in FIG. 5E and underlying portions of the inactive region 17 as shown in FIG. 6E which leads the gate electrode (GATE) in the gate channel to a contact pad 60, FIG. 8.

Several observations shown are noted. First, referring to FIG. 8, the pads 18 in each pair of the pads 18 are disposed along parallel lines displaced from a line passing through the gate electrode (GATE) portion on the active semiconductor region 16. Next, the gate electrode extends from the active semiconductor region 16 to a region on the substrate off of the active semiconductor region 16 between each one the two pair of pads 18.

A number of embodiments of the disclosure have been described. Nevertheless, it will be understood that various modifications may be made without departing from the spirit and scope of the disclosure. For example, the pads 18' may be separate from the source and drain contacts, as shown in FIG. 9. Accordingly, other embodiments are within the scope of the following claims.

What is claimed is:

1. A method for firming a semiconductor structure, such structure having: a substrate; an active device formed in an active semiconductor region of the substrate, the active device having a control electrode for controlling a flow of carriers through a channel region of the active semiconductor region between a pair of electrical contacts, the method comprising:

forming the pair of contacts in ohmic contact with the active semiconductor region;

forming a dielectric layer over a surface of the structure, the dielectric layer being disposed over the active semiconductor region where the control electrode is to be formed, over the pair of contacts and also over a pair of photolithographic, thickness non uniformity, compensation features disposed laterally adjacent to, but off of, the active semiconductor region and on an inactive semiconductor region;

forming a photoresist layer over the dielectric layer;

forming a window through the photoresist layer using optical photolithographic-etching processing using a single mask, the window having two portions, one portion being a narrower opening portion with length L1 over the active semiconductor region where the channel region is to be formed and a second portion having a wider opening L2, where the length L2 is wider than the length L1, over the of active semiconductor region to expose underlying portions of the dielectric layer;

etching away the exposed portions of the dielectric layer to expose an underlying portions of the substrate both over the active semiconductor region and the off active semiconductor region; and forming the control electrode in Schottky contact with the active semiconductor region on the exposed portions of the substrate.

2. The method recited in claim 1 wherein the features comprises pads on the surface of the substrate and on the inactive region.

3. The method recited in claim 1 wherein the features comprises two pair of pads on opposite sides of the active semiconductor region.

4. The method recited in claim 3 wherein the pads in each pair of the pads are disposed along parallel lines displaced from a line passing through the control electrode.

5. The method recited in claim 1 wherein the compensation features comprises a region in the control electrode on the inactive region wider than a region of the control electrode on the active semiconductor region and narrower than the contact pad for the control electrode.

6. A method for forming a semiconductor structure, such structure having: a substrate; an active device formed in an active semiconductor region of the substrate, the active device having a control electrode, disposed along a horizontal direction, for controlling a flow of carriers through a channel region of the active semiconductor region along a direction perpendicular to the longitudinal direction between a pair of electrical contacts, the method comprising:

forming the pair of electrical contacts in ohmic contact with the active semiconductor region and a pair of photolithographic, thickness non-uniformity, compensation features, the pair of features being: aligned with a one side of the pair of electrical contacts; off of the active semiconductor region; laterally off of a common side of the active semiconductor region; and disposed along a direction being perpendicular to the longitudinal direction;

forming a dielectric layer over a surface of the structure, the dielectric layer being disposed over the active semiconductor region where the control electrode is to be formed, over the pair of electrical contacts and also over the pair photolithographic, thickness non-uniformity, compensation features;

forming a photoresist layer over the dielectric layer and over the pair of photolithographic, thickness non-uniformity, compensation features forming pooling regions of the photoresist layer over the inactive semiconductor region off of the active semiconductor region between the pair of features;

forming single mask over the photoresist layer using optical photolithographic-etching processing, the single mask having a window through the photoresist layer, the window having two portions, one portion being a narrower opening portion with length L1 over the active semiconductor region where the control electrode is to be formed and a second portion having a wider opening L2, where the length L2 is wider than the length L1, the second portion being disposed over the pooling region;

etching away the exposed portions of the dielectric layer to expose an underlying portions of the substrate both over the active semiconductor region and the off active semiconductor region, the etched narrower portion exposing a Schottky gate contact portion of the active semiconductor region where the control electrode is to be formed; and forming the control electrode in Schottky contact with the gate contact portion of active semiconductor region.

* * * * *